US008527928B1

(12) United States Patent  
Gopalakrishnan et al.

(10) Patent No.: US 8,527,928 B1  
(45) Date of Patent: Sep. 3, 2013

(54) OPTIMIZING CIRCUIT LAYOUTS BY CONFIGURING ROOMS FOR PLACING DEVICES

(75) Inventors: Prakash Gopalakrishnan, Pittsburgh, PA (US); Alisa Yurovsky, Pittsburgh, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 437 days.

(21) Appl. No.: 12/655,092

(22) Filed: Dec. 23, 2009

Related U.S. Application Data

(62) Division of application No. 11/231,055, filed on Sep. 19, 2005, now Pat. No. 7,665,054.

(51) Int. Cl.  
*G06F 17/50* (2006.01)

(52) U.S. Cl.  
USPC ........... 716/119; 716/104; 716/106; 716/107; 716/109; 716/110; 716/112; 716/122; 716/123; 716/124; 716/132; 716/139

(58) Field of Classification Search  
USPC ................. 716/104, 106, 107, 109, 110, 112, 716/119, 122, 123, 124, 132, 139  
See application file for complete search history.

(56) References Cited

U.S. PATENT DOCUMENTS

| | | | |
|---|---|---|---|
| 4,554,625 A | 11/1985 | Otten | |
| 5,604,680 A * | 2/1997 | Bamji et al. | 716/118 |
| 6,011,911 A | 1/2000 | Ho et al. | |
| 6,066,180 A | 5/2000 | Kim et al. | |
| 6,090,153 A * | 7/2000 | Chen et al. | 716/109 |
| 6,161,078 A | 12/2000 | Ganley | |
| 6,269,277 B1 * | 7/2001 | Hershenson et al. | 700/97 |
| 6,282,694 B1 | 8/2001 | Cheng et al. | |
| 6,367,052 B1 | 4/2002 | Steinberg et al. | |
| 6,389,582 B1 | 5/2002 | Valainis et al. | |
| 6,446,239 B1 * | 9/2002 | Markosian et al. | 716/122 |
| 6,449,761 B1 * | 9/2002 | Greidinger et al. | 716/122 |
| 6,550,046 B1 | 4/2003 | Balasa et al. | |
| 6,643,834 B2 * | 11/2003 | Satoh et al. | 716/139 |
| 6,651,235 B2 * | 11/2003 | Dai et al. | 716/55 |

(Continued)

OTHER PUBLICATIONS

Bhattacharya et al.; "Hierarchical extraction and verification of symmetry constraints for analog layout automation"; Publication Year: 2004; Design Automation Conference, 2004. Proceedings of the ASP-DAC 2004. Asia and South Pacific pp. 400-405.*

(Continued)

*Primary Examiner* — Helen Rossoshek  
(74) *Attorney, Agent, or Firm* — Schwegman Lundberg & Woessner, P.A.

(57) ABSTRACT

A computer-readable medium stores a specification for a circuit layout. The specification includes: a configuration of rooms for placing devices, one or more room constraints for the configuration of rooms, one or more groups of devices for the rooms, and one or more device constraints for devices in a same room. The configuration of rooms may include a tree-structure for the rooms. The room constraints may include a common symmetry line for a first room and a second room. The device constraints may include a self-symmetry constraint for a first device about a symmetry line in a first room. The device constraints may include a symmetry constraint for a first device and a second device about a symmetry line in a first room. The devices may include analog or RF (radio frequency) devices.

20 Claims, 18 Drawing Sheets

(56) References Cited

U.S. PATENT DOCUMENTS

| | | | |
|---|---|---|---|
| 6,651,237 B2 * | 11/2003 | Cooke et al. | 716/124 |
| 6,668,365 B2 * | 12/2003 | Harn | 716/123 |
| 6,678,644 B1 | 1/2004 | Segal | |
| 6,732,336 B2 * | 5/2004 | Nystrom et al. | 716/104 |
| 6,760,900 B2 * | 7/2004 | Rategh et al. | 716/55 |
| 6,789,246 B1 * | 9/2004 | Mohan et al. | 716/112 |
| 6,802,050 B2 * | 10/2004 | Shen et al. | 716/55 |
| 6,874,133 B2 * | 3/2005 | Gopalakrishnan et al. | 716/122 |
| 6,918,102 B2 * | 7/2005 | Rutenbar et al. | 716/122 |
| 6,948,145 B2 * | 9/2005 | Brown et al. | 716/119 |
| 7,065,727 B2 | 6/2006 | Hershenson et al. | |
| 7,080,336 B2 * | 7/2006 | Teig et al. | 716/122 |
| 7,093,220 B2 * | 8/2006 | Fallon et al. | 716/122 |
| 7,100,137 B2 * | 8/2006 | Teig et al. | 716/123 |
| 7,184,919 B2 * | 2/2007 | Carbonell et al. | 702/122 |
| 7,191,112 B2 * | 3/2007 | Demler et al. | 703/14 |
| 7,331,026 B2 * | 2/2008 | Sampath | 716/112 |
| 7,350,164 B2 * | 3/2008 | Xu et al. | 716/122 |
| 7,386,823 B2 * | 6/2008 | Tsai et al. | 716/102 |
| 7,448,003 B2 * | 11/2008 | Zhang et al. | 716/103 |
| 7,516,433 B1 * | 4/2009 | Pucci et al. | 716/119 |
| 7,533,358 B2 * | 5/2009 | Gopalakrishnan et al. | 716/135 |
| 7,584,440 B2 * | 9/2009 | Yan et al. | 716/106 |
| 7,594,214 B1 * | 9/2009 | Salowe et al. | 716/119 |
| 7,603,642 B2 * | 10/2009 | Subasic et al. | 716/119 |
| 7,665,054 B1 * | 2/2010 | Gopalakrishnan et al. | 716/122 |
| 7,752,590 B1 * | 7/2010 | Chyan et al. | 716/122 |
| 2002/0087939 A1 * | 7/2002 | Greidinger et al. | 716/2 |
| 2002/0184603 A1 * | 12/2002 | Hassibi et al. | 716/2 |
| 2004/0153278 A1 * | 8/2004 | Zhang et al. | 702/117 |
| 2004/0153982 A1 * | 8/2004 | Zhang et al. | 716/4 |
| 2005/0273732 A1 * | 12/2005 | Xu et al. | 716/2 |
| 2008/0016483 A1 * | 1/2008 | Chan | 716/11 |
| 2008/0104548 A1 * | 5/2008 | Yan et al. | 716/1 |
| 2008/0104557 A1 * | 5/2008 | Gopalakrishnan et al. | 716/5 |
| 2009/0113369 A1 * | 4/2009 | Colwell et al. | 716/11 |

OTHER PUBLICATIONS

Balasa et al.; "Using red-black interval trees in device-level analog placement with symmetry constraints"; Publication Year: 2003; Design Automation Conference, 2003. Proceedings of the ASP-DAC 2003. Asia and South Pacific; pp. 777-782.*

Balasa et al.; "On the exploration of the solution space in analog placement with symmetry constraints"; Publication Year: 2004; Computer-Aided Design of Integrated Circuits and Systems, IEEE Transactions on; vol. 23 , Issue: 2; pp. 177-191.*

Balasa et al.; "Efficient solution space exploration based on segment trees in analog placement with symmetry constraints"; Publication Year: 2002; Computer Aided Design, 2002. ICCAD 2002. IEEE/ACM International Conference on pp. 497-502.*

Mehranfar; "A technology-independent approach to custom analog cell generation"; Publication Year: 1991; Solid-State Circuits, IEEE Journal of; vol. 26 , Issue: 3; pp. 386-393.*

Balasa et al.; "Symmetry within the sequence-pair representation in the context of placement for analog design"; Publication Year: 2000; Computer-Aided Design of Integrated Circuits and Systems, IEEE Transactions on; vol. 19 , Issue: 7; pp. 721-731.*

Balasa, et al., "On the exploration of the solution space in analog placement with symmetry constraints", IEEE Transactions on Computer-Aided Design of Integrated Circuits and Systems, 23 (2), (2004), 177-191.

Balasa, F, et al., "Device-Level Placement for Analog Layout: An Opportunity for Non-Slicing Topological Representations", Proc. Asia and South-Pacific Design Automation Conf. (ASP-DAC), Yokohama, Japan, (Jan.-Feb. 2001), 281-286.

Balasa, F, et al., "Module Placement for Analog Layout Using the Sequence-Pair Representation", Proc. of the 36th ACM/IEEE Design Automation Conf. (DAC) New Orleans, LA, (Jun. 1999), 274-279.

Balasa, F, et al., "Symmetry Within the Sequence-Pair Representation in the Context of Placement for Analog Design", IEEE Transactions on Computer-Aided Design of Integrated Circuits and Systems, 19 (7), (2000), 721-731.

Balasa, F., et al., "Efficient solution space exploration based on segment trees in analog placement with symmetry constraints", IEEE/ACM International Conference onComputer Aided Design (ICCAD), (Nov. 10-14, 2002), 497-502.

Bhattacharya, et al., "Hierarchical extraction and verification of symetry constraints for analog layout automation", Proceedings of the Asia and South Pacific Design Automation Conference (ASP-DAC), (Jan. 27-30, 2004), 400-405.

Brandolese, M, et al., "Analog Circuits Placement: A Constraint Driven Methodology", IEEE International Symposium on Circuits and Systems (ISCAS), Atlanta, Georgia, (1996), 635-638.

Cohn, J M, et al., "KOAN/ANAGRAM II: New Tools for Device-Level Analog Placement and Routing", IEEE JSSC, 26 (3), (Mar. 1991), 330-342.

Felt, E, et al., "An Efficient Methodology for Symbolic Compaction of Analog IC's With Multiple Symmetry Constrains", Proc. European Design Automation Conference, Hamburg, Germany, (1992), 148-153.

Felt, E, et al., "Performance-Driven Compaction for Analog Integrated Circuits", Proc. IEEE 1993 Custom Integrated Circuits Conference, San Diego, CA, (May 9-12, 1993), pp. 17.3.1-17.3.5.

Ganley, J, "Efficient Solution of Systems of Orientation Constraints", Proc. International Symposium on Physical Design, Monterrey, CA, (Apr. 12-14, 1999), 140-144.

Guo, P N, et al., "An O-Tree Representation of Non-Slicing Floorplan and Its Application", Proc. ACM/IEEE Design Automation Conference, New Orleans, LA, (Jun. 21-25, 1999), 268-273.

Jangkrajarng, et al., "Multiple specifications radio-frequency integrated circuit design with automatic template-driven layout retargeting", Proceedings of the Asia and South Pacific Design Automation Conference (ASP-DAC), (Jan. 27-30, 2004), 394-399.

Jepsen, D W, et al., "Macro Placement by Monte Carlo Annealing", Proc. IEEE International Conference on Computer Design, (Nov. 1984), 495-498.

Kleinhans, J M., et al., "GORDIAN: VLSI Placement by Quadratic Programming and Slicing Optimization", IEEE Transactions on Computer-Aided Design, 10, (Mar. 1991), 356-365.

Lapotin, D. P, "Method for Improving Geometric Packaging of Circuit Chip Modules: Utilizing Top-Down Slicing-Based Floorplanning", IBM Technical Disclosure Bulletin, TBD-ACC-NO NN8712251, vol. 30 (7), (Dec. 1, 1987), 251-253.

Liu, E C, et al., "Slicing Floorplan Design With Boundary-Constrained Modules", Proceedings of the 2001 International Symposium on Physical Design, Sonoma, CA, (Apr. 1-4, 2001), 124-129.

Malavasi, E, et al., "Quick Placement With Geometric Constraints", IEEE 1997 Custom Integrated Circuits Conference, Santa Clara, CA, (May 5-8, 1997), 561-564.

Malavisi, E, "Virtual Symmetry Axes for the Layout of Analog IC's", Proc. 2nd ICVC, Seoul, Korea, 1-10.

Maruvada, Sarat C, et al., "Placement with symmetry constraints for analog layout using red-black trees", 2003 International Symposium on Circuits and Systems, vol. 5, (May 25-28, 2003), V489-V92.

Mitra, S, et al., "System Level Routing of Mixed-Signal ASIC's in WREN", 1992 IEEE/ACM International Conference on Computer-Aided Design, 1992. ICCAD-92. Digest of Technical Papers., (Nov. 8-12, 1992), 394-399.

Murata, H, et al., "VLSI Module Placement Based on Rectangle-Packaging by the Sequence Pair", IEEE Transactions on Computer-Aided Design of Integrated Circuits and Systems, 15 (12), (Dec. 1996), 1518-1524.

Okuda, R, et al., "An Efficient Algorithm for Layout Compaction Problem With Symmetry Constraints", Proc. IBBI CCAD, Santa Clara, CA, (Nov. 5-9, 1989), 148-151.

Pang, Y, et al., "Block Placement Symmetry Constraints Based on the O-Tree Non-Slicing Representation", Proc. ACM/IEEE Design Automation Conference, Los Angeles, CA, (Jun. 5-9, 2000), 464-467.

Pillan, M, et al., "Constraint Generation and Placement for Automatic Layout Design of Analog Integrated Circuits", Proc. IEEE International Symposium on Circuits and Systems, vol. 1, (1994), 355-358.

Prieto, J A, et al., "A performance-driven placement algorithm with simultaneous Place&Route optimization for analog IC'", European Design and Test Conference, (Mar. 17-20, 1997), 389-394.

Prieto, J A, et al., "An Algorithm for the Place-And-Route Problem in the Layout of Analog Circuits", Proc. IEEE ISCAS, London, UK, (May 30-Jun. 2, 1994), 491-494.

Sait, S M, et al., "", In: VLSI Physical Design Automation: Theory and Practice, IEEE Press: Piscataway, NJ, (1995), pp. 1-33, 388-403.

Shah, A, et al., "High Performace CMOS—Amplifier Design Uses Front-to-Back Analog Flow", <http://www.edn.com/article/482720-High_performance_CMOS_amplifier_design_uses_front_to_back_analog_flow.php>, (Oct. 31, 2002), 6 pgs.

Van Ginneken, L, et al., "Optimal Slicing of Plane Point Placements", Proceedings of the European Design Automation Conference (EADC), (1990), 322-326.

Wong, D F, et al., "A New Algorithm for Floorplan Design", Proceedings of the 23rd ACM/IEEE Design Automation Conference, (1996), 101-107.

* cited by examiner

```
( — (children
  ( | (children
          (Collections (props \"(members <devnames> )\"))
          (NamedGroup (props \"(members <groupname> )\"))
      )
  )
)
(Collections (props \"(members <devnames> )\")
```

FIG. 5

```
( - (children
    ( | (children
        (Collection (props \"(members M1 M2 M3 )\"))
        (Collection (props \"(members M4 M5 M6 )\"))
    )
    (Collection (props \"(members R1 )\"))
)
```

```
( | (children (NamedGroup (props \"(members Group1)\"))
    ( | (children
            (NamedGroup (props \"(members Group2)\"))
            ( - (children
                    (NamedGroup (props \"(members Group4)\"))
                    (NamedGroup (props \"(members Group3)\"))
                )
            )
        )
    )
)
```

Schematic With Annotations

OPTIMIZING CIRCUIT LAYOUTS BY CONFIGURING ROOMS FOR PLACING DEVICES

This application is a divisional application of U.S. patent application Ser. No. 11/231,055, filed on Sep. 19, 2005, and issued Feb. 16, 2010, as U.S. Pat. No. 7,665,054, the contents of which are hereby incorporated by reference as if set forth in their entirety.

BACKGROUND OF THE INVENTION

The present invention relates generally to circuit layouts and more particularly to optimizing circuit layouts for analog and RF (radio frequency) circuits.

Circuit design for analog and RF circuits poses a number of unique challenges. In order for a circuit to perform correctly when manufactured using a semi-conductor process, several techniques have been employed when positioning devices (i.e., analog and RF devices) in the layout.

For example, a common technique involves matching the ratios of sizes, orientations and other properties between one or more devices in order to achieve electrical equivalence between these devices when manufactured. Additionally, in order to minimize the influence of process variations, certain groups of devices are placed in close proximity to each other. Another common matching technique involves positioning devices "symmetrically" by mirroring their orientations and usually aligning them in one dimension an equal distance from a specified symmetry line.

Analog and RF circuits often have several groups of devices, where each group must be individually arranged in proximity to one another as described above and where each group often requires local symmetry lines to position devices in symmetric arrangements within that group. Grouping of devices is also performed to isolate certain devices from other groups by surrounding them with a guard-ringed structure in the layout, or inserting them into a certain type of well in the semiconductor process. Once these devices are grouped, an additional requirement involves matching variations across these groups. This is accomplished by aligning the symmetry lines of these groups with respect to each other or by aligning the group boundaries with respect to each other. Sometimes, two or more devices that need to be matched very strongly may be combined into a single layout instance, often referred to as a "compound device." These devices may be combined using user specified patterns to ensure perfect matching.

An additional objective when arranging these devices is to minimize the lengths of various connections between the devices in the circuit. These connections are often implemented using metal wires, and minimizing their lengths reduces the amount of space and material needed for implementation. Further, the resistances and capacitances introduced by these wires can adversely affect the electrical behavior of the circuit, and these effects need to be minimized as well. Certain connections in the circuit sometimes have more impact on the performance than other connections. It is therefore desirable to reduce lengths of specific paths or connections depending on the flow of currents and signals through the circuit. These signal and current paths are often identified by circuit designers who perform simulations of the electrical behavior of the circuit. This information is then either conveyed to a layout designer, who arranges the devices in the layout, or is used by the circuit designers themselves if they implement the layout on their own. An example involves identifying DC current paths through the circuit from the current source (often the positive voltage source, VDD) to the current sinks (often the negative voltage source, VSS, or the ground connection, GND). The devices in the layout are then arranged to minimize the lengths of wires connecting from the current sources to various devices and then to the current sinks.

While accounting for these various considerations, it is also necessary to meet several process design rule criteria for successful fabrication. An example is the restriction imposed on the minimum spacing between geometry on a given mask layer. This further imposes restrictions on the distances between various devices in the layout. Another objective is to minimize the total area occupied by all the devices, in order to minimize the mask costs during fabrication.

In some contexts, circuit layout design is discussed in terms of cell layout design, where a cell is a device arrangement that can be used as a building block for larger circuits. Then the area of a given cell may also be constrained by how this cell is packaged along with other cells when finishing the block-level layout. These constraints may be captured as restrictions on the height and/or width of the cell layout. Sometimes, the shape of the cell area may also be restricted to a certain rectilinear arrangement to fit with other cells. For example, the cell may be L-shaped instead of rectangular. Certain regions in the cell layout may also be designated as "keep-out" regions where one may not place any other devices. This latter construct is useful to reserve space for inserting other devices and/or geometry at a later point in the design cycle.

Currently most designers implement their semiconductor layouts manually for analog and RF circuits. Positioning the devices for matching, symmetry, grouping, minimizing area, wire-length, lengths of signal paths, etc., is performed by hand. Information regarding matching requirements, symmetry, critical signal and DC paths, observed from electrical simulations, is often annotated as text or graphics on the schematic by the designers. The layout designer then uses this information as a guideline when positioning these devices. At other times, for simplicity, the layout designer may position the devices as they are observed on the schematic, assuming that the positions of these devices on the schematic are an indication of the proximity of devices and optimal with regard to minimum lengths of critical signal or current paths. Another simple approach involves looking at previous implementations of the circuit, for example, a layout performed for a similar schematic, or a layout performed for a different set of device parameters for the same schematic, or a circuit implemented in a different semiconductor technology for the same or similar schematic. The layout designer then arranges the layout to look similar to the previous layout, with regard to the positioning of certain devices and/or groups of devices.

Some constraints like matching, symmetry and design rules, however, are very difficult to precisely implement by hand. Further, since there are a large number of possible arrangements of devices in a layout, it can be very difficult to analyze the impact of multiple tradeoffs between objectives like wire-length, area and lengths of signal paths manually. To address this, some conventional tools automate the generation of Analog and RF layouts by capturing these requirements as analytical constraints, possibly represented on a discrete grid for placing devices. Some of these approaches are described, for example, in analog design articles. (A. Shah, S Dugalleix and F Lemery, "High-performance CMOS-amplifier design uses front-to-back analog flow", EDN design feature, Oct. 31, 2002.) However, these tools are typically limited in their ability to optimize performance features while imposing design constraints such as symmetry, matching and grouping. For example, a grid formulation may limit placement options such as the orientation of devices. Further, these tools are also typically limited in their ability to support "layout migration", where a previously determined layout is taken as a starting point for a modified set of constraints or optimization criteria.

Thus, there is a need for improved methods and systems for optimizing circuit layouts, especially in applications involving analog and RF circuits.

SUMMARY OF THE INVENTION

In one embodiment of the present invention, a computer-readable medium stores a specification for a circuit layout. The specification includes: a configuration of rooms for placing devices, one or more room constraints for the configuration of rooms, one or more groups of devices for the rooms, and one or more device constraints for devices in a same room.

According to one aspect of this embodiment, the configuration of rooms may include a tree-structure for the rooms. According to another aspect, the room constraints may include a common symmetry line for a first room and a second room. According to another aspect, the device constraints may include a self-symmetry constraint for a first device about a symmetry line in a first room. According to another aspect, the device constraints may include a symmetry constraint for a first device and a second device about a symmetry line in a first room. According to another aspect, the devices may be analog or RP (radio frequency) devices.

In another embodiment of the present invention, a system for determining a specification for a circuit layout includes a user interface and a computer-readable medium. The user interface receives input from a user for determining a configuration of rooms for placing devices, one or more room constraints for the configuration of rooms, one or more groups of devices for the rooms, and one or more device constraints for devices in a same room. The computer-readable medium stores the specification for the circuit layout, where the specification includes the configuration of rooms, the one or more room constraints, the one or more groups of devices, and the one or more device constraints.

This embodiment may include aspects described above. According to another aspect, the user interface may include a graphical user interface that displays a tree-structure for the configuration of rooms. Further, the graphical user interface may display a reference circuit layout and the input from the user may determine at least some of the tree-structure from the reference circuit layout. Further, the graphical user interface may display a reference circuit schematic, and the input from the user may determine at least some of the tree-structure from the reference circuit schematic.

In another embodiment of the present invention, a method of determining a circuit layout includes: determining a configuration of rooms for placing devices, determining one or more room constraints for the configuration of rooms, determining one or more groups of devices for the rooms, and determining one or more device constraints for devices in a same room.

This embodiment may include aspects described above. According to another aspect, the method may further include determining, from the configuration of rooms, the one or more room constraints, the one or more groups of devices, and the one or more device constraints, a first placement of devices and a first positioning of rooms. The first placement of devices includes first spatial coordinates for the devices in the rooms, and the first positioning of rooms includes first spatial coordinates for boundaries of the rooms.

Further, the configuration of rooms may include a tree-structure for the rooms, and determining the first placement of devices and the first positioning of rooms may include searching the tree structure to determine the placement of the devices in each room and the positioning of said each room.

Further, the method may include: determining, from the first placement of devices and the first positioning of rooms, a first cost value; determining, from the first placement of devices, a second placement of devices, wherein the second placement of devices includes second spatial coordinates for the devices in the rooms; determining, from the first positioning of rooms and the second placement of devices, a second positioning of rooms, wherein the second positioning of rooms includes second spatial coordinates for the boundaries of the rooms; and determining, from the second placement of devices and the second positioning of rooms, a second cost value. Further, determining the second placement of devices may include perturbing the first placement of devices.

Additional embodiments relate to an apparatus that carries out the method and a computer-readable medium that stores (e.g., tangibly embodies) a computer program that carries out the method.

In this way the present invention enables improved methods and systems for optimizing circuit layouts, especially in applications involving analog and RF circuits.

BRIEF DESCRIPTION OF THE DRAWINGS

FIG. 5 shows an exemplary string format for a cell-plan tree.

FIG. 7 shows an exemplary cell-plan string related to the embodiment shown in FIG. 6.

FIG. 9 shows an exemplary cell-plan string related to the embodiment shown in FIG. 8.

DETAILED DESCRIPTION OF EXEMPLARY EMBODIMENTS

Figure 1:
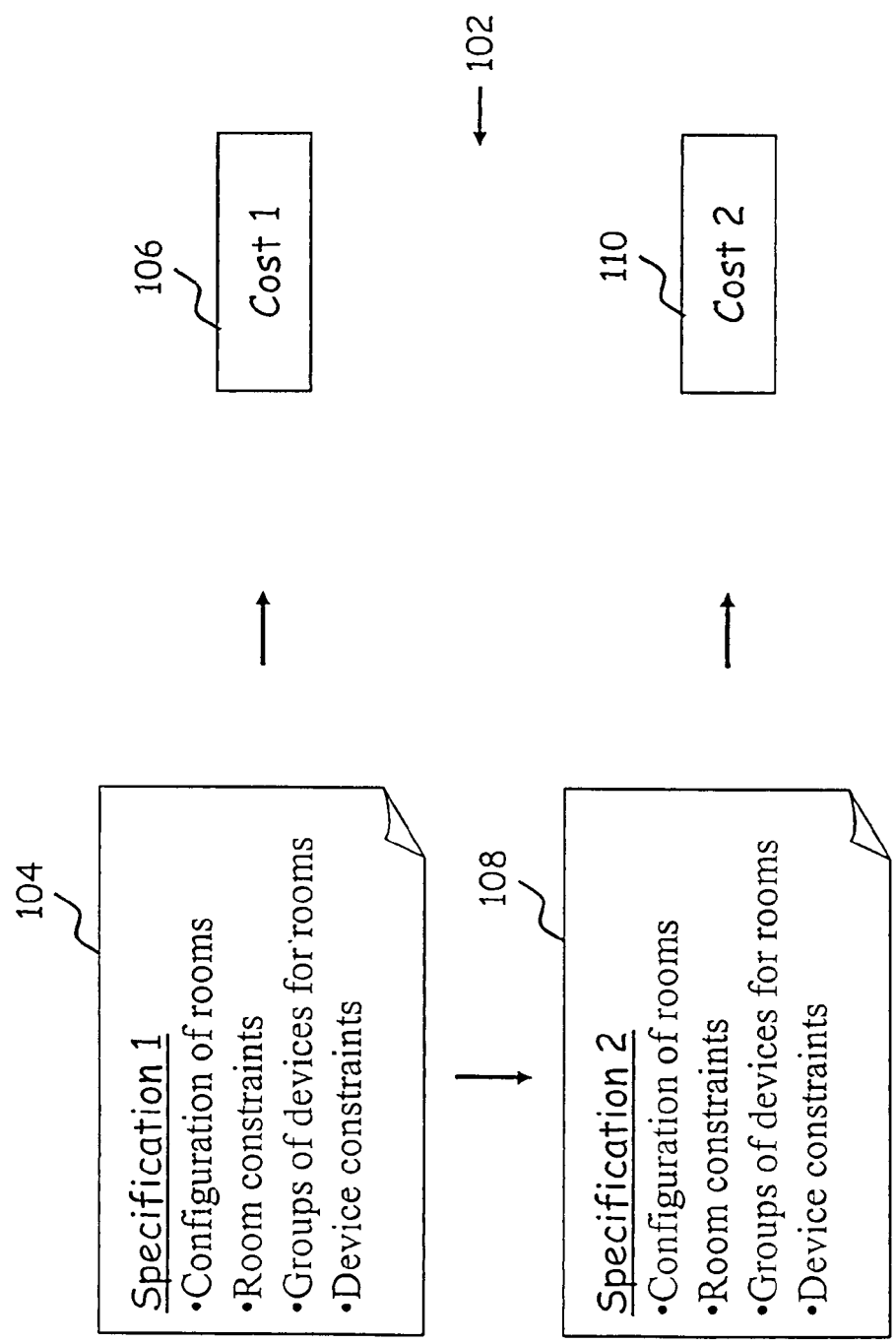
FIG. 1 shows an exemplary method for optimizing a circuit layout.

An embodiment of the present invention is shown in FIG. 1. A method 102 for optimizing a circuit layout includes determining a first layout specification 104 that includes a configuration of rooms for placing devices, one or more room constraints for the configuration of rooms, one or more groups of devices for the rooms, and one or more device constraints for devices in the same room. More specific examples of a specification 104 are discussed below to illustrate arrangements that include constraints on rooms and devices for a circuit layout with particular focus on analog and RF (radio frequency) layouts although other applications are possible. A first cost value 106 measures one or more optimization criteria such a path length, area, or gain. Next a second specification 108 is determined possibly by some adjustment or perturbation of the first specification 104 and a corresponding second cost value 110 is determined for comparison with the first cost value 106. This process can be terminated at this stage if either the first specification 104 or the second specification 108 is satisfactory (e.g., as measured by the corresponding cost values 106, 110), or alternatively the process may be continued by generating additional specifications and cost values.

The following sections present further details related to various embodiments of the present invention as illustrated in FIG. 1.

Section 1 presents details related to using specifications 104, 108 to specify the relative locations and relationships between devices or groups of devices in a circuit. The structures described herein are generally applicable to circuit layouts but are especially advantageous for the types of constraints encountered in analog and RF circuit layouts including matching, symmetry and grouping constraints. Additional constraints may, for example, include constraints for relative locations of devices or groups of devices, alignment of symmetry lines and group boundaries, and defining keep-out regions in a cell relative to certain devices or groups of devices.

In some contexts the focus will be on a cell-plan that includes elements of the specification other than same-room device constraints. That is, a cell-plan typically includes a configuration of rooms for placing devices, one or more room constraints for the configuration of rooms, and one or more groups of devices for the rooms. This focus may be desirable when the cell-plan portion of a specification is most likely to be usable for future designs. For the case where the specification does not include same-room constraints, the cell-plan is the specification.

In general, the specification or cell-plan can be technology and device parameter independent, in that it does not change when device sizes vary, the design goals change or the process technology changes.

Section 2 presents details related to using specifications (and cell-plans) to optimize the circuit performance and layout according to some cost function 106, 110. A designer can create a cell-plan by observing the flow of signals or currents in a circuit. This information may be gathered from the electrical behavior of the circuit, for example, via the electrical simulations, or from prior knowledge of the working of the circuit. A designer may also create the cell-plan by observing the locations of device symbols on the schematic to produce a layout similar to the arrangement on a schematic. A designer may also create a cell-plan by looking at a previous layout implementation of the circuit. The cell-plan can be conveyed in a written or graphic form by a circuit designer to a layout designer, who can then either generate a layout that adheres to a cell-plan constraint or further optimize the circuit layout generated using a cell-plan constraint.

Section 3 presents details related to software architectures for implementing the specifications 104, 108 and related methods 102 that maintain the constraints in the layout design. In an assisted interactive environment, the software may provide automated techniques to enforce some or all of the constraints (e.g., room constraints and device constraints). This can ensure that in addition to meeting typical requirements for symmetry, matching and grouping, the design result will also meet other requirements for devices and groups of device that may be critical, for example, to minimize lengths of signal and current paths in the circuit.

1. Creating Cell-Plans and Specifications

Figure 2:
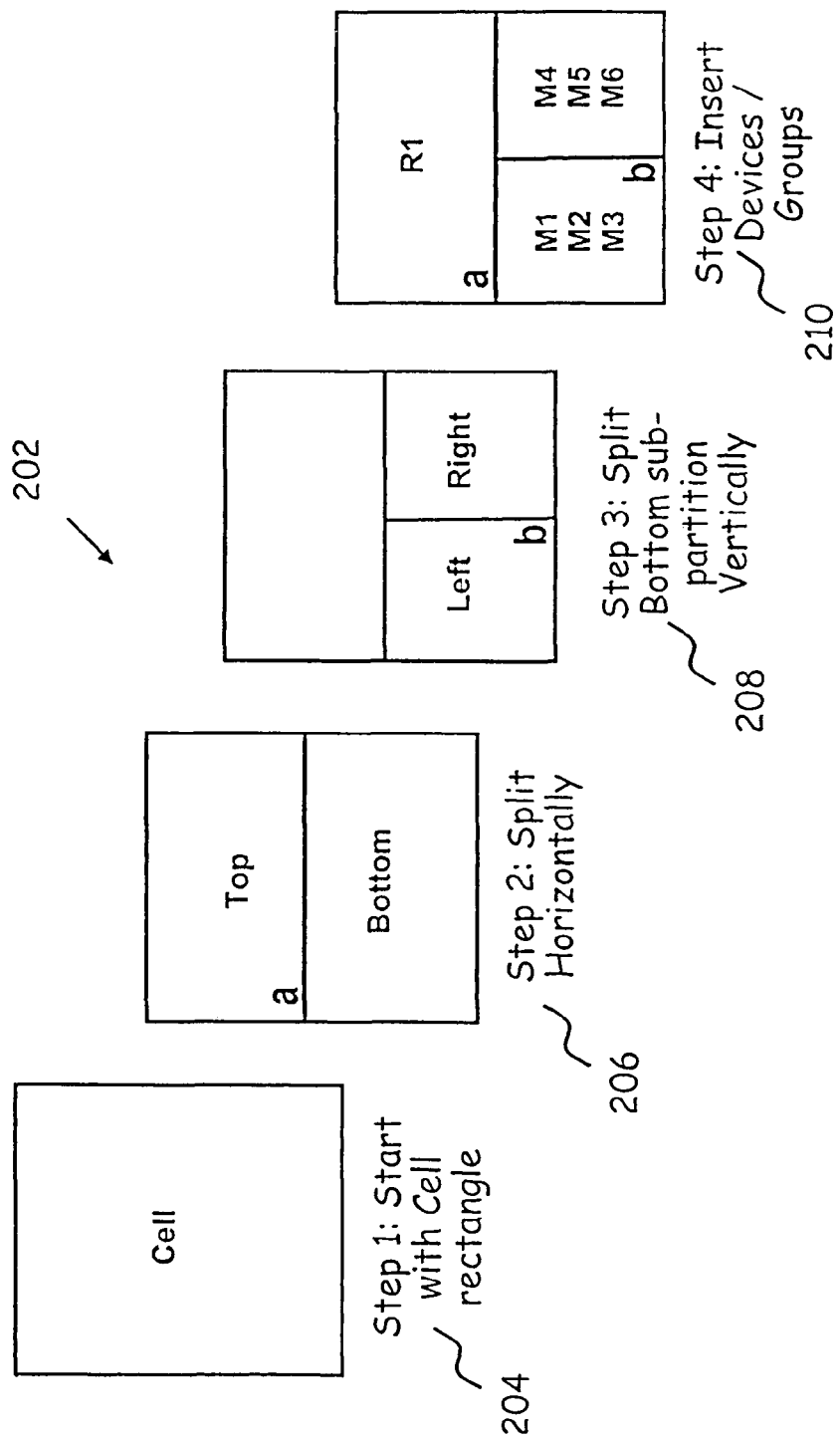
FIG. 2 shows an exemplary method for creating a cell-plan.

FIG. 2 shows an exemplary method 202 for creating a cell-plan for specifying a circuit layout. In a first step 204, a cell rectangle is introduced. In a second step 206 the cell rectangle is split horizontally (at line a) into a top portion and a bottom portion. In a third step 208 the bottom portion is split vertically (at line b) into a left and right portion. In a fourth step 210 devices (or groups of devices) are inserted into the separated portions, which are called rooms. In FIG. 2, the devices include a resistor R1 and transistors M1, M2, M3, M4, M5, and M6.

In general, the cell area is divided into rooms by recursively partitioning it using horizontal and/or vertical partition lines. Devices and/or groups of devices are then inserted as members of rooms. FIG. 2 shows how an exemplary cell-plan is created by recursively partitioning the cell area into rooms using horizontal and vertical partition lines so that devices can be inserted into the rooms.

In this way topological relationships can be specified between devices and groups of devices. These relationships are implied by the partitions used to create these rooms and the insertion of devices and/or groups of devices into these rooms. For example, for the cell-plan described in FIG. 2, the group of devices M1, M2, and M3 are constrained to be topologically to the left of the group of devices M4, M5, and M6. This topological relationship applies to the geometric bounding box of the groups of devices and not to the individual devices themselves. This relationship is specified by the vertical partition-line b. Similarly, the partition-line a specifies that all devices and/or groups in the sub-partition/rooms below it are topologically to the bottom of all devices and/or groups in the sub-partition/rooms above it. In this example, this implies that the bounding box of all devices M1, M2, M3, M4, M5, and M6 must be topologically below the bounding box of device R1.

Figure 3:
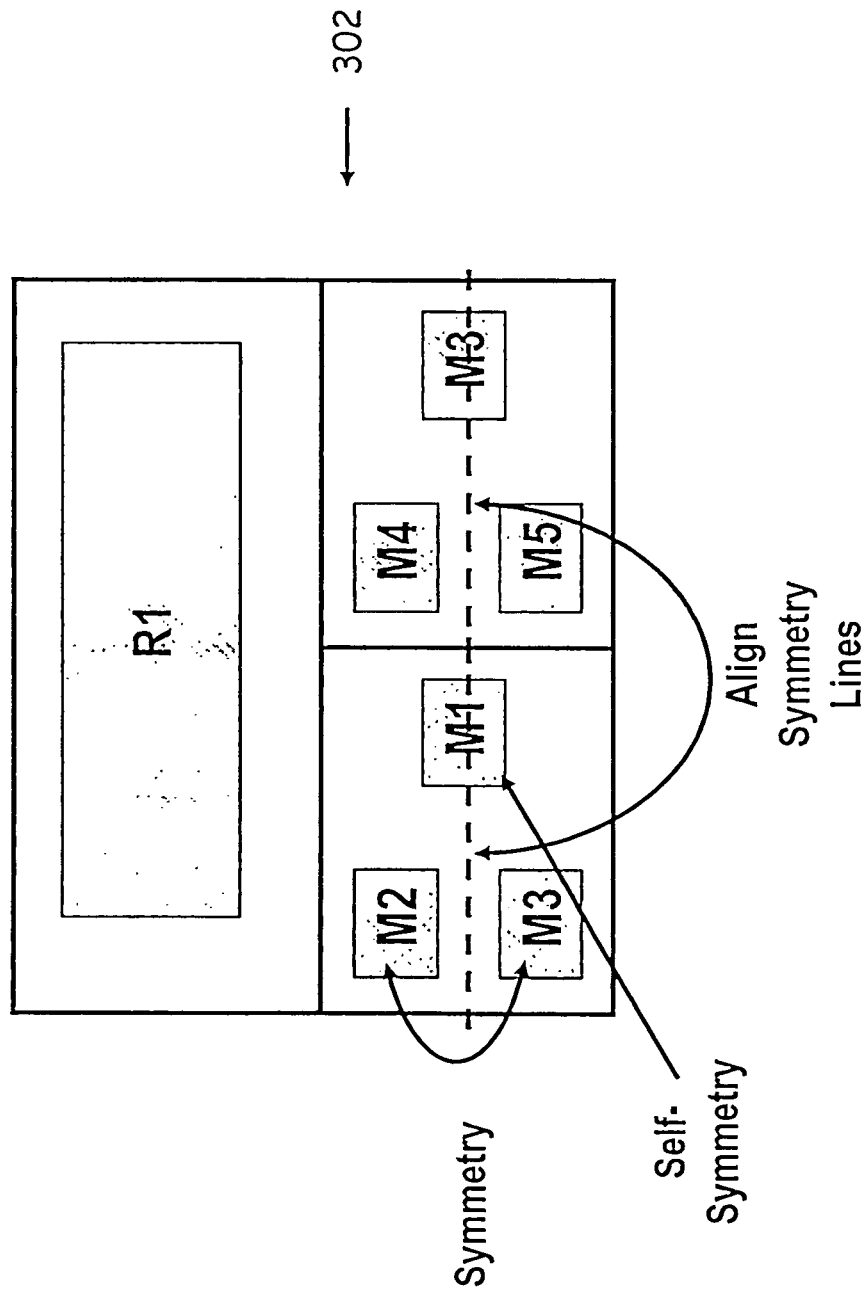
FIG. 3 shows an exemplary cell-plan design with symmetry constraints.

Optional relationships can be specified between devices and/or groups within a room. That is, a cell-plan can be augmented by same-room constraints. For example, devices inside a room can be specified to have symmetry, matching and grouping constraints. The room may possess a symmetry line to which, the devices within the room can be constrained to be locally symmetric. FIG. 3 shows an exemplary cell-plan 302 where devices M2 and M3 are constrained to be symmetric with each other with respect to the local symmetry line. Device M1 is also constrained to be self-symmetric with respect to the local symmetry line. The groups may further be constrained as "free-form" or "grid-form" groups depending on whether coordinates must be specified on a grid.

Optional relationships can be specified between various rooms. For example, the symmetry lines belonging to adjacent rooms can be constrained to be aligned with each other as shown in FIG. 3. The boundaries of two groups in adjacent rooms may also be specified to be aligned to each other. Certain adjacent rooms may be specified to share certain geometry, for example, well geometry. Multiple adjacent rooms may be enclosed within the same guard-ring.

Figure 4:
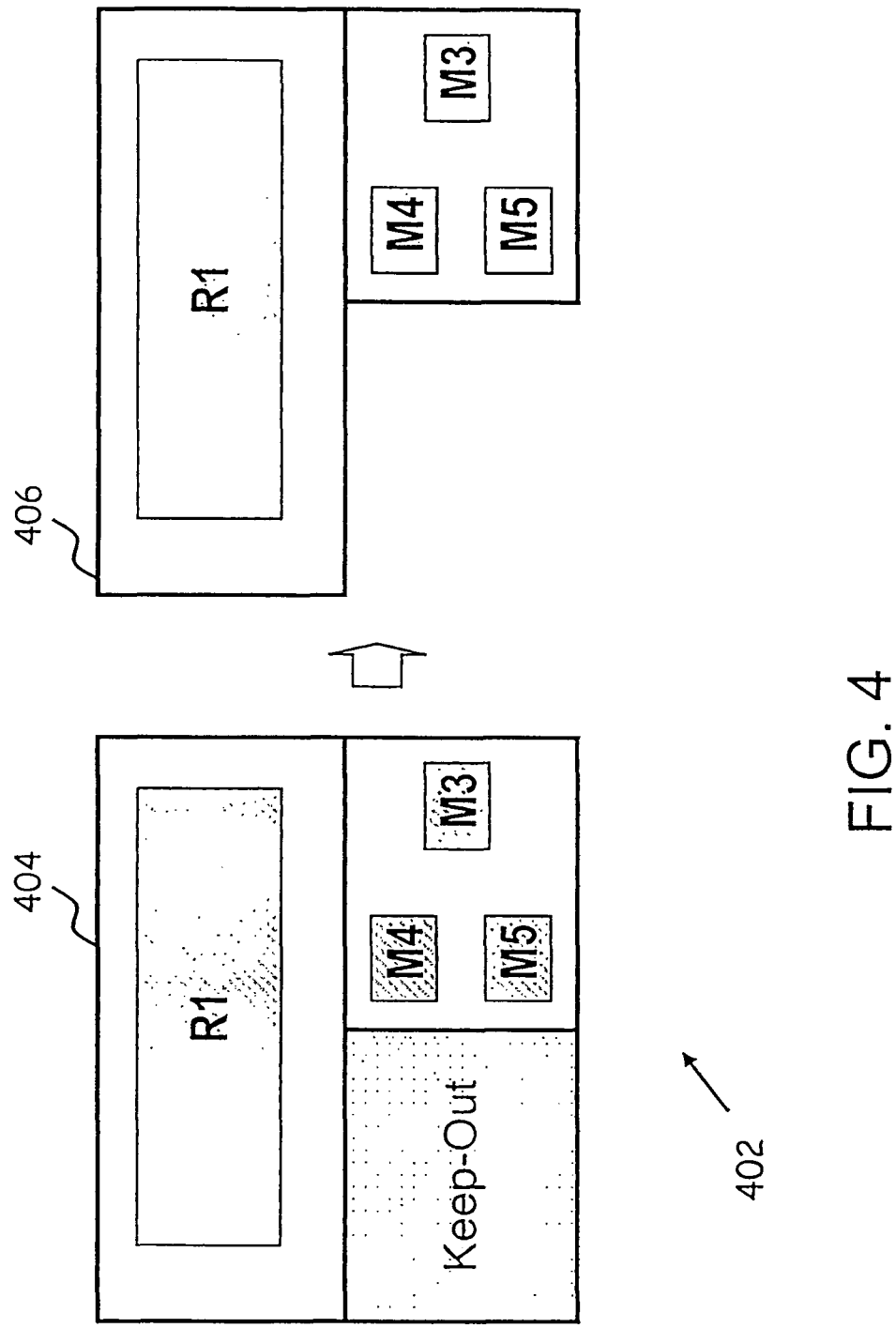
FIG. 4 shows an exemplary cell-plan design with a keep-out region.

Optional properties can be specified on rooms and the dimensions of the rooms. For example, certain rooms can be marked as keep-out regions with a certain height/width associated with the keep-out region. FIG. 4 shows an exemplary cell-plan design 402 where a room is marked as a keep-out region. Note that specifying a corner room to be a keep-out region in the original cell 404 results in a final L-shaped cell 406. Certain rooms may also be specified to be enclosed within an isolation ring, like a guard-ring.

Optional relationships can be specified between objects outside a room with respect to the room itself. For example, I/O (input/output) pins that belong to the cell may be constrained to be symmetric with respect to a room's symmetry line.

In some embodiments the cell-plan can be augmented with additional same-room constraints for symmetry, matching and grouping constraints necessary for Analog & RF circuit layouts.

For example, when specifying a cell-plan constraint, both devices that are part of a symmetry constraint can be inserted into the same room. When a device is inserted into a room, the user-interface may automatically insert its symmetric partner into the same room or provide the user with an error message when the partner is inserted into a different room. When the devices are inside the same room, their symmetry constraints are interpreted as local symmetry constraints, with respect to the local symmetry line of the room they belong to. This is consistent with desired behavior for grouped devices to be placed symmetrically around a local symmetry line.

Relationships between devices that belong to different rooms can be achieved by specifying relationships between the symmetry lines of the different rooms and/or the boundaries of groups within different rooms and then specifying a relationship between the devices inside the rooms to their local symmetry lines. For example, a device A can be placed self-symmetrically (aligned to the local symmetry line) inside Room-A. A device B can be placed self-symmetrically inside Room-B. If the symmetry lines of Room-A and Room-B are aligned to each other, the devices A and B are automatically aligned to each other. Those skilled in the art may extend this specification to allow symmetric partners to exist in neighboring rooms with additional restrictions on the legal topological relationships that work in combination with such a specification.

Other constraints can also be incorporated into this framework. All devices that exist in a "Proximity Matching" constraint can be inserted into the same room. This is consistent with the desired behavior of these devices to be placed in close proximity to each other. Devices that are part of other "Orientation Matching" and "Device Matching" constraints may exist in the same or different rooms. "Group" constraints may be automatically generated when devices are inserted into a room. Groups that are explicitly created independently of the cell-plan specification can co-exist with a cell-plan specification since the user can simply insert these groups along with devices into a room in the cell-plan. Such a group of devices can be further constrained into a grid-like arrangement such as a "grid-form" in order to further constrain the relative locations of the individual devices. All devices that are part of a "Compound Device" can be inserted into the same room since this is consistent with the desired characteristic that these devices should be placed together.

In some embodiments cell-plan constraints can be created by the user using a graphical interface. Some of these steps are illustrated using the example in FIG. 2. For example, the graphical interface starts with a single rectangle 204 representing the cell area. The user can then sub-divide the cell-area into partitions. For this purpose, the user may choose to "Split Horizontally" or "Split Vertically". When the user chooses to "Split Horizontally" and clicks inside the cell area, the cell area is then divided into two partitions, one above the other, separated by a horizontal partition line. Each of these partitions can further be split either horizontally or vertically to create further sub-partitions, as illustrated in the second step 206 and the third step 208.

Once the desired partitions are created, the user can add devices and/or groups of devices into these rooms. The list of members in each room can be generated by selecting the components on the schematic and/or by typing their names in by hand as illustrated in the fourth step 210.

The user can specify properties on rooms by selecting those rooms and specifying the appropriate property. For example, rooms can be designated as keep-out regions or isolated using guard-rings. Multiple rooms can be specified to be surrounded by a common isolation ring, like a guard-ring.

The user can specify relationships between adjacent rooms. For example, one can specify the symmetry lines and/or group boundaries of adjacent rooms to be aligned. One can also automatically create these constraints for adjacent rooms that are created recursively, using the same direction for splitting, consecutively (i.e., one immediately following the other).

The cell-plan constraint can then be saved to a text-based constraint representation, which can then be read back for editing purposes. A text-based representation of the Cell-Plan is useful to save this information in a user-editable form. We now describe one way in which the user can represent this information in a textual form.

The topological relationship represented by the cell-plan can be expressed in a binary tree format, which enumerates the relative locations between the devices and/or groups. This can then be captured using a string-based representation of the binary tree. FIG. 5 shows an exemplary recursive keyword-based string format 502 for a cell-plan tree. The keywords "|" and "-" are used to represent the vertical and horizontal cut-lines, respectively. The keyword "children" points to the left/right or bottom/top children of each node in the tree. The left or bottom children are always listed first. The keyword "Collection" represents a list of physical layout device names or group names. This keyword is used for listing devices and groups that are all placed within the same cell room. The keyword "NamedGroup" represents a single group name, which is the only group occupying that particular cell room. This keyword is used only if a cell room is solely occupied by a single group. The structure of this tree and thereby this string-based representation 502, is very similar to the way the cell-plan is drawn as illustrated in the following examples.

Figure 6:
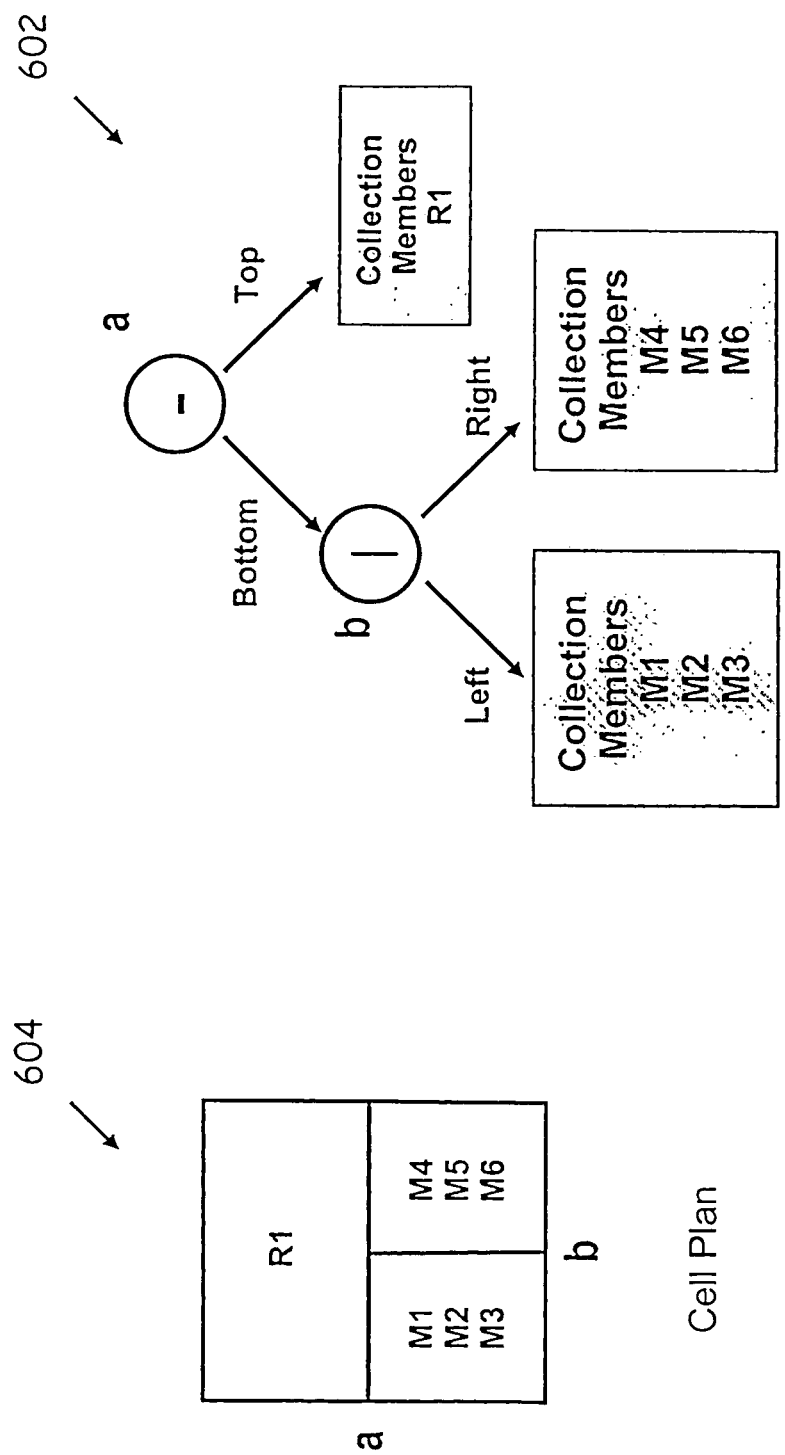
FIG. 6 shows an exemplary binary-tree representation of a cell-plan.

FIG. 6 shows the binary-tree representation 602 of a corresponding cell-plan 604. A corresponding cell-plan string 702 is shown in FIG. 7. The first horizontal cut line a on the tree structure 602 is represented by one child (i.e., the left branch of the tree, which in this case represents the "bottom" in the cell-plan 604), and a collection with member R1, which represents the right branch or "top" of the cut line in the cell-plan 604. The bottom branch of the tree 602 is then cut vertically at line b) split into one collection, the "Left" group of devices (i.e., M1, M2, M3), and the second collection, the "Right" group of devices, (i.e., M4, M5, M6).

Figure 8:
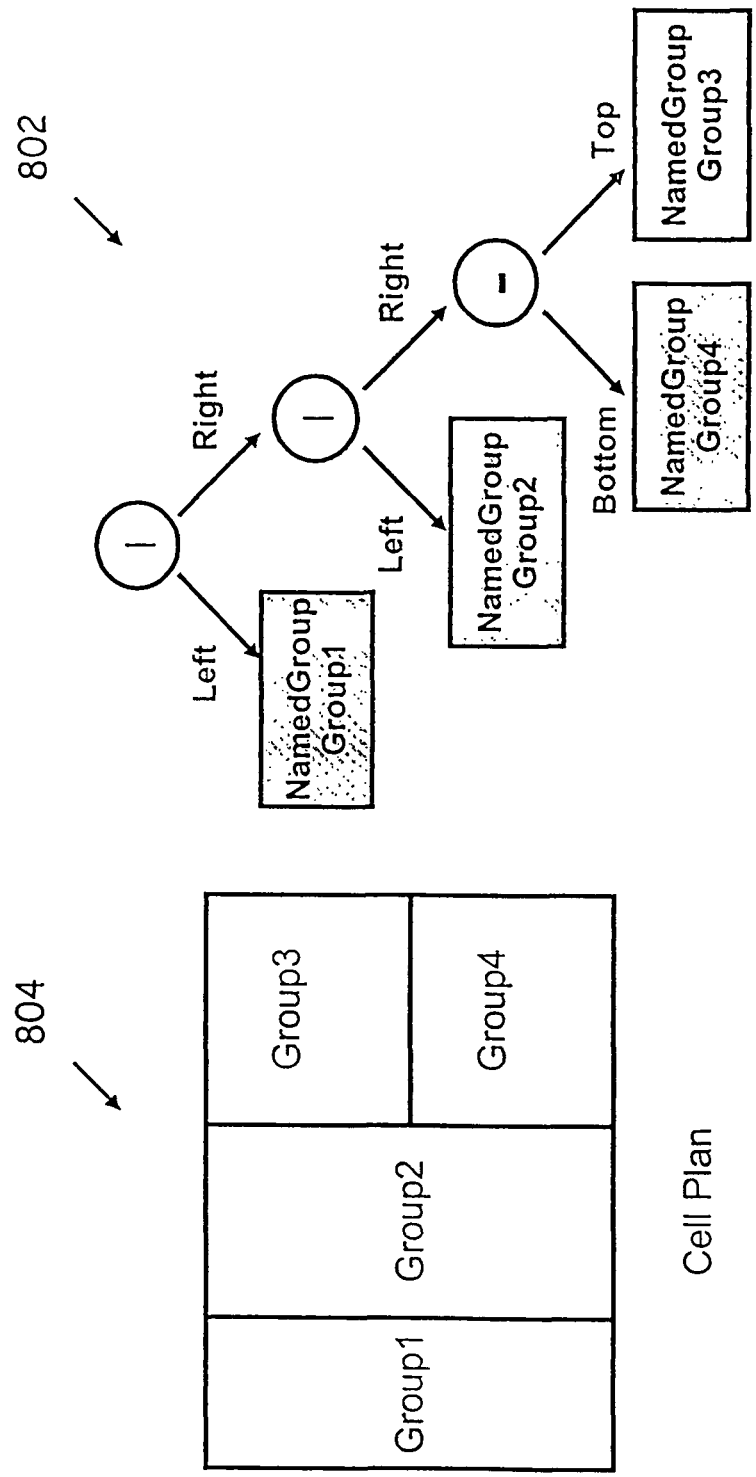
FIG. 8 shows an exemplary binary-tree representation of a cell-plan.

FIG. 8 shows another example for a binary tree representation 802 of a cell-plan 804, where each room in the cell-plan 804 contains a group. A corresponding cell-plan string 902 is shown in FIG. 9.

The use of cell-plans or specifications provides the ability to capture relative locations of devices and/or groups of devices in the presence of symmetry, matching and grouping constraints that are necessary for Analog/RF circuits. In the context of circuit design, this allows devices within groups/rooms to re-orient and re-position themselves to consider alternate placement arrangements, while at the same time maintaining the topological arrangements between groups/rooms.

2. Using a Cell-Plan or Specification to Optimize a Circuit Layout

This section describes how a cell-plan (or specification) can be used within a design flow to optimize the performance of the circuit and/or the layout. There are several ways in which this can be accomplished. These include various combinations of: (a) how a cell-plan is created before and/or after creating a layout; (b) how a cell-plan is communicated before and/or after creating a layout; and (c) how a cell-plan is followed when creating and/or adjusting a layout.

In creating a cell-plan from a circuit schematic, a circuit designer might first identify the critical signal paths and/or DC current paths in the circuit. Reducing the lengths of critical signal paths takes precedence over reducing length of other connections. The designer may obtain this information from prior experience or from measurements based on results from the electrical stimulation of the circuit.

Figure 10:
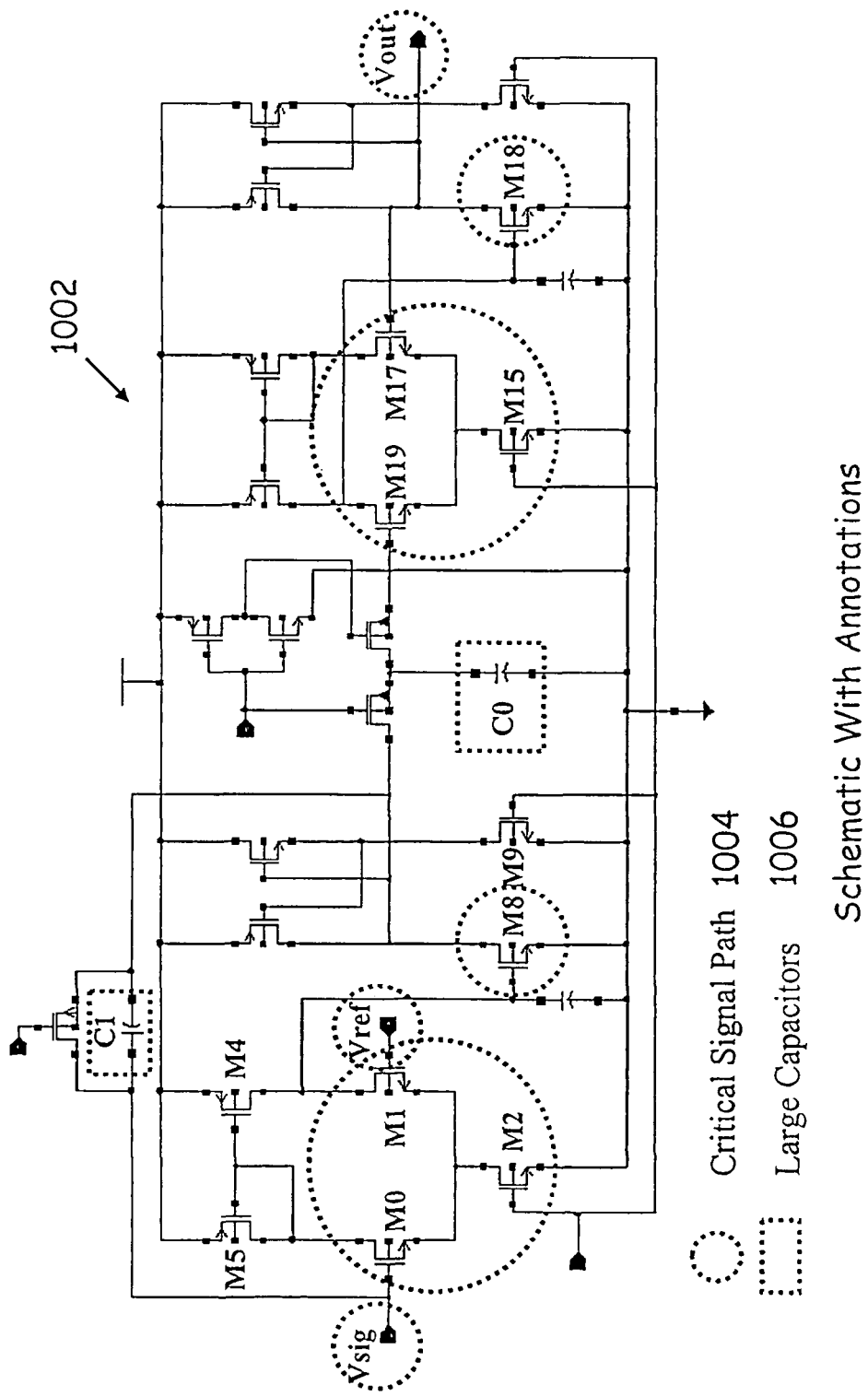
FIG. 10 shows an exemplary circuit schematic.

FIG. 10 shows a circuit schematic 1002 that represents a video circuit driver. The schematic includes transistor devices M0, M1, M2, M4, M5, M8, M9, M15, M17, M18, and M19, capacitors C0, and C1, and I/O pins, Vsig, Vref, and Vout. Critical signal paths 1004 are indicated with dotted circles, and large capacitors 1006 are indicated by dotted squares.

In this example, the designer has identified the transistors that are part of the critical signal path 1004. For example, in FIG. 10 the signal flows from input I/O pins, Vsig & Vref, through the transistors M0, M1, M2, M8, M19, M17, M15, and M18, to the output I/O pin Vout. Further, the designer knows that these transistors that make up the critical signal path must be positioned far away from the clocked circuitry in the circuit, namely the mixed-signal transistors and the large capacitors 1006 (i.e., capacitors C0 and C1).

Figure 11:
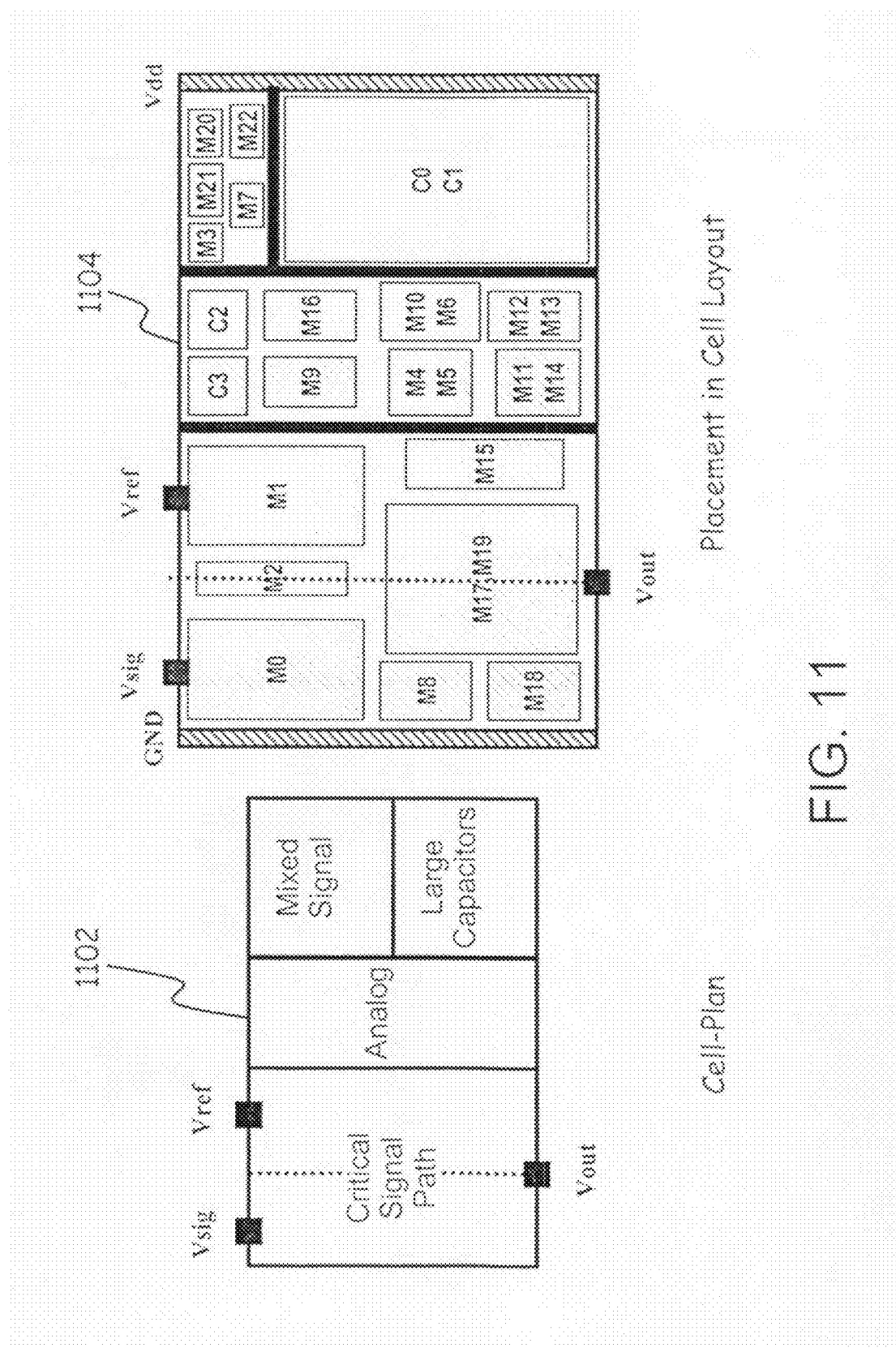
FIG. 11 shows an exemplary cell plan and corresponding layout related to the embodiment shown in FIG. 10.

In order to capture this information, a cell-plan 1102 can be created as shown in FIG. 11. Note that the cell-plan 1102 has been created such that the transistors that are part of the critical signal path are positioned to the left, far away from the transistors that are part of the mixed-signal circuitry and the large capacitors. The rest of the transistors and capacitors that belong to the regular analog circuitry are positioned in between them. Also note that the designer has specified that the input I/O pins Vsig and Vref are to be positioned symmetrically with respect to the local symmetry line of the room containing the critical signal path.

This cell-plan specification 1102 can now be followed when creating a layout 1104. Note that the topological relationship specified by the cell-plan constraint 1102 has been enforced in this layout 1104. As a result, the transistors belonging to the critical signal path in the layout 1104 are positioned to the left of the analog circuitry which is further positioned to the left of the mixed-signal circuit and the large capacitors. Further, the I/O pins Vsig and Vref are also positioned symmetrically with respect to the local symmetry line of the critical signal path.

As shown in FIG. 11, the critical signal path in the layout 1104 includes devices M0, M1, M2, M8, M15, M17, M18, and M19. The Analog devices include capacitors C2 and C3 and devices M4, M5, M6, M9, M10, M11, M12, M13, M14, and M16. The mixed-signal devices include M3, M7, M20, M21, and M22. The large capacitors include C0 and C1.

In other cases, a designer may identify the DC current paths through the circuit. These are the connections from the current source (often the positive voltage source, VDD) to the current sinks (often the negative voltage source, VSS or the ground connection, GND). Once these are identified, the transistors connecting these current paths can be positioned in adjacent rooms in the cell-plan, so as to minimize the lengths of these connections.

A cell-plan can also be created by observing the position of the device symbols on the schematic. This assumes that the person drawing the schematic already positioned these symbols in the schematic correctly. Such a cell-plan can be used to generate a layout that resembles, in part, the position of the device symbols on the schematic.

A cell-plan may also be created from a pre-existing layout. Such a layout may exist from previous implementations of the circuit in a different technology, previous implementations of similar circuits or previous implementation of the same circuit using a different set of device parameters. Once a previous layout exists, the circuit designer and/or the layout designer can draw a cell-plan to closely follow the positions of the devices in the existing layout. Such a cell-plan can then be used to generate a layout that resembles, in part, the existing layout.

Once a cell-plan has been created, it can be saved along with the schematic in a graphical form and/or a textual representation. Such information can then be conveyed to a layout designer who can follow that information when creating a layout. Such information may also be reused by the same designer, who created it, at a later time in the design cycle. Capturing the cell-plan in a reusable form also provides the capability to correct parts of it, in case more information is available at a later point in the design cycle, for example, from electrical simulations after extracting the parasitic resistances and capacitors in the layout.

Once a cell-plan is available, a layout designer can use the cell-plan to create a layout. The cell-plan can also be used by automatic and/or assisted interactive software that adheres to the cell-plan's constraints.

The layout designer may also choose to follow most of the relationships specified by the cell-plan, but violate parts of it. For example, the boundaries of the rooms need not be straight lines, in case the layout can be packed more tightly. However, following most of the cell-plan specification ensures that the devices are positioned in a fashion as intended by the designer, for example, to minimize the lengths of certain connections in the circuit.

The layout designer may choose to further optimize a layout after creating an initial layout using the cell-plan. In cases where major changes are then made, the layout designer may choose to record this information in a new cell-plan by editing the previous cell-plan. Such information is very useful in further re-tuning the layout at a later point in the design cycle in case the technology, the device parameters, the design goals and/or the circuit itself changes.

As illustrated by the embodiments discussed above, the present invention enables a designer to formally capture the requirements for physical adjacency, separation and topological relationships that are useful for optimizing the performance of a circuit layout. For example, one can use the cell-plan constraint to minimize the lengths of critical signal paths and/or DC current paths in the circuit. Since this constraint can be captured in a graphical and textual manner, it can be formally communicated from one designer to another.

It can also be stored in a way that is substantially independent of related technologies and parameter values, thereby making it easy to reuse when device parameters, design goals, and/or technologies change.

3. Software Architecture that Enforces Constraints for a Cell-Plan or Specification According to another embodiment of the present invention, a software architecture can be implemented to enforce a cell-plan constraint (or more generally a specification constraint) in the context of circuit layout design. As discussed below, a slicing-tree can be used to represent the configuration of rooms, which can then be augmented to support one or more device constraints for devices in a same room and also to support one or more room constraints.

A slicing-tree characterization has been used conventionally to represent floorplans for block-level digital circuits. As described in conventional slicing-tree references, a slicing-style layout is one that can be derived by recursively "slicing" a rectangle into rooms. The process stops when each component to be placed can be assigned to a single room in the rectangle. (D. F. Wong, C. L. Liu, "A new algorithm for floorplan design," Proceedings of the 23rd ACM/IEEE Design Automation Conference, p. 101-107, July 1986; L van Ginneken, R Otten, "Optimal slicing of plane point placements," Proceedings of the European Design Automation Conference, 1990. EDAC, 322-326.)

Figure 12:
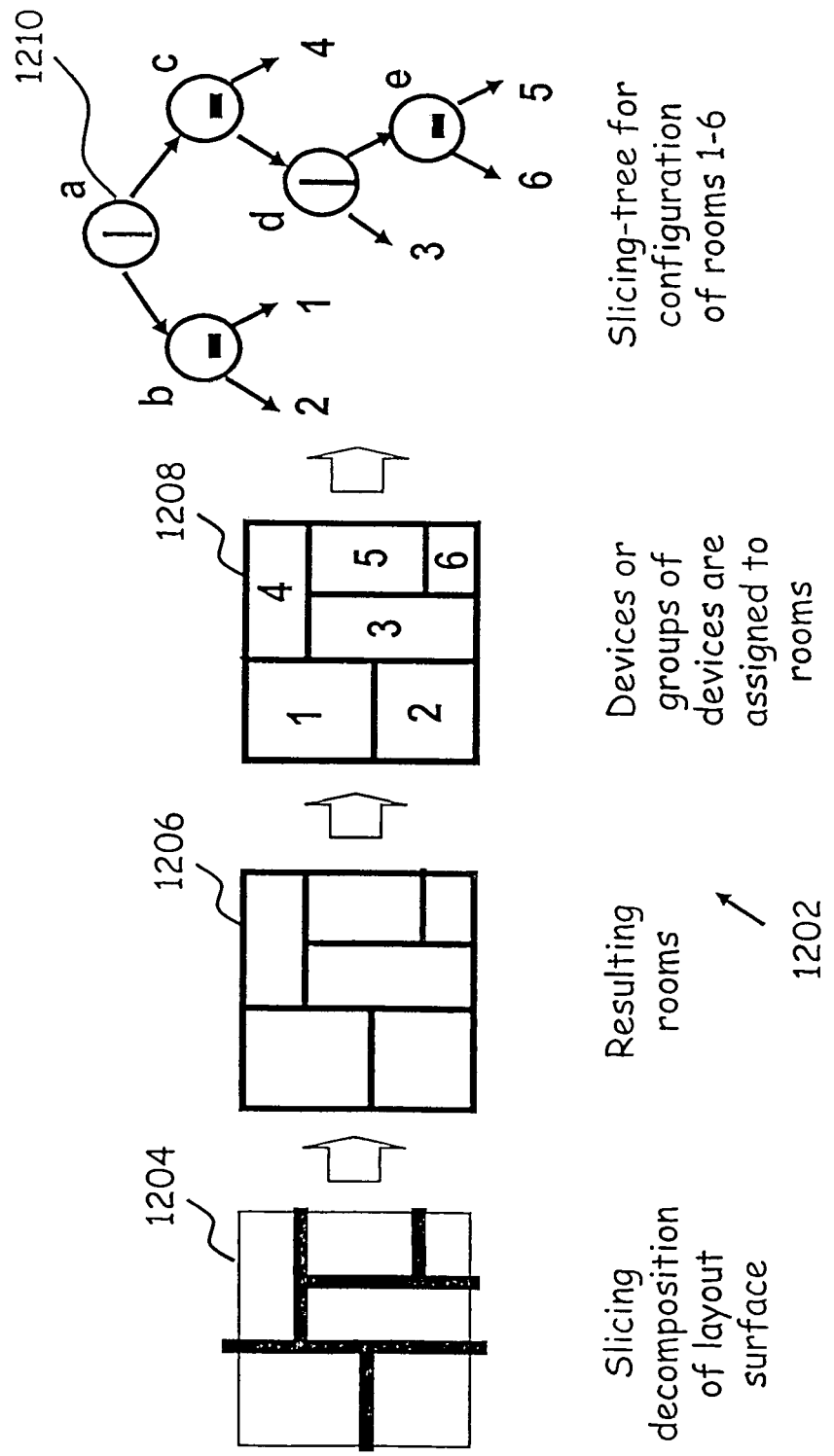
FIG. 12 shows an exemplary method for making a slicing-tree representation for a configuration of rooms.

FIG. 12 shows an exemplary slicing-tree representation for a configuration of rooms. In this example, the rectangle represents the layout surface and the component refers to all members of a room. The slicing-tree method 1202 is shown in four steps including a slicing decomposition of a layout surface 1204, the resulting configuration with six rooms 1206, an assignment 1208 of six components (i.e., devices or groups of devices) to the rooms, and a slicing tree 1210 for the configuration of six rooms.

While the slicing-tree based approach has been previously used for representing floorplans for block-level digital circuits, this approach can be augmented according to the present invention to include constrained optimization for analog and RF circuit designs, as discussed below.

The slicing tree configuration for rooms can be augmented to support one or more device constraints between members of devices in the same room using technology disclosed in U.S. patent application Ser. No. 10/674,085, filed Sep. 29, 2003, entitled "Method for Generating Constrained Component Placement for Integrated Circuits and Packages," and issued Aug. 15, 2006, as U.S. Pat. No. 7,093,220. This application is incorporated herein by reference in its entirety. This technology employs a tree structure, hereafter referred to as constrained-component-tree, to represent devices and groups of devices with one or more device constraints between them.

While the constrained-component-tree has been used in the above-cited application to represent and place devices in an overall cell layout, this technology can be adapted according to the present invention to augment the slicing tree configuration of rooms so as to represent and place devices within the same room with one or more same-room constraints.

Figure 13:
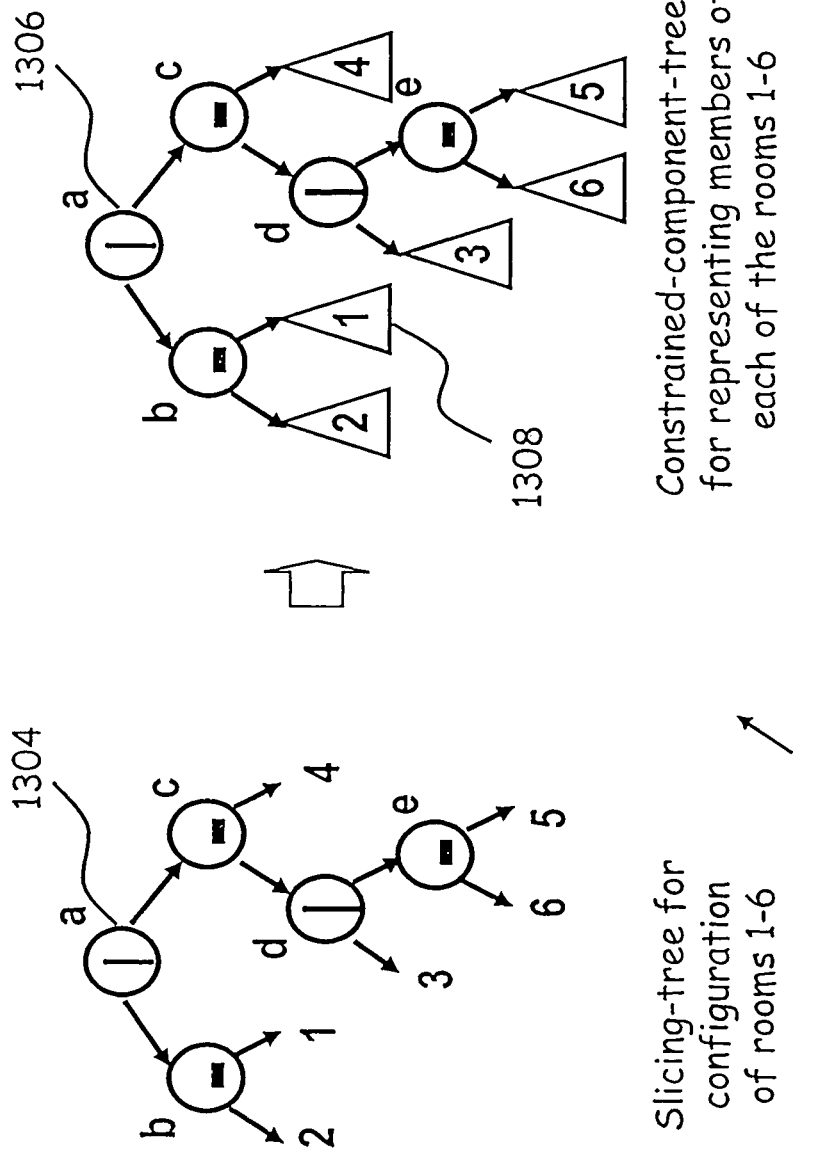
FIG. 13 shows an exemplary augmentation of a slicing-tree representation to include constrained-component-trees.

FIG. 13 shows an exemplary augmentation 1302 where a slicing tree 1304 representing a configuration of six rooms is augmented to provide a slicing tree 1306 with constrained-component-trees 1308 to represent member devices within each of the six rooms.

Figure 14:
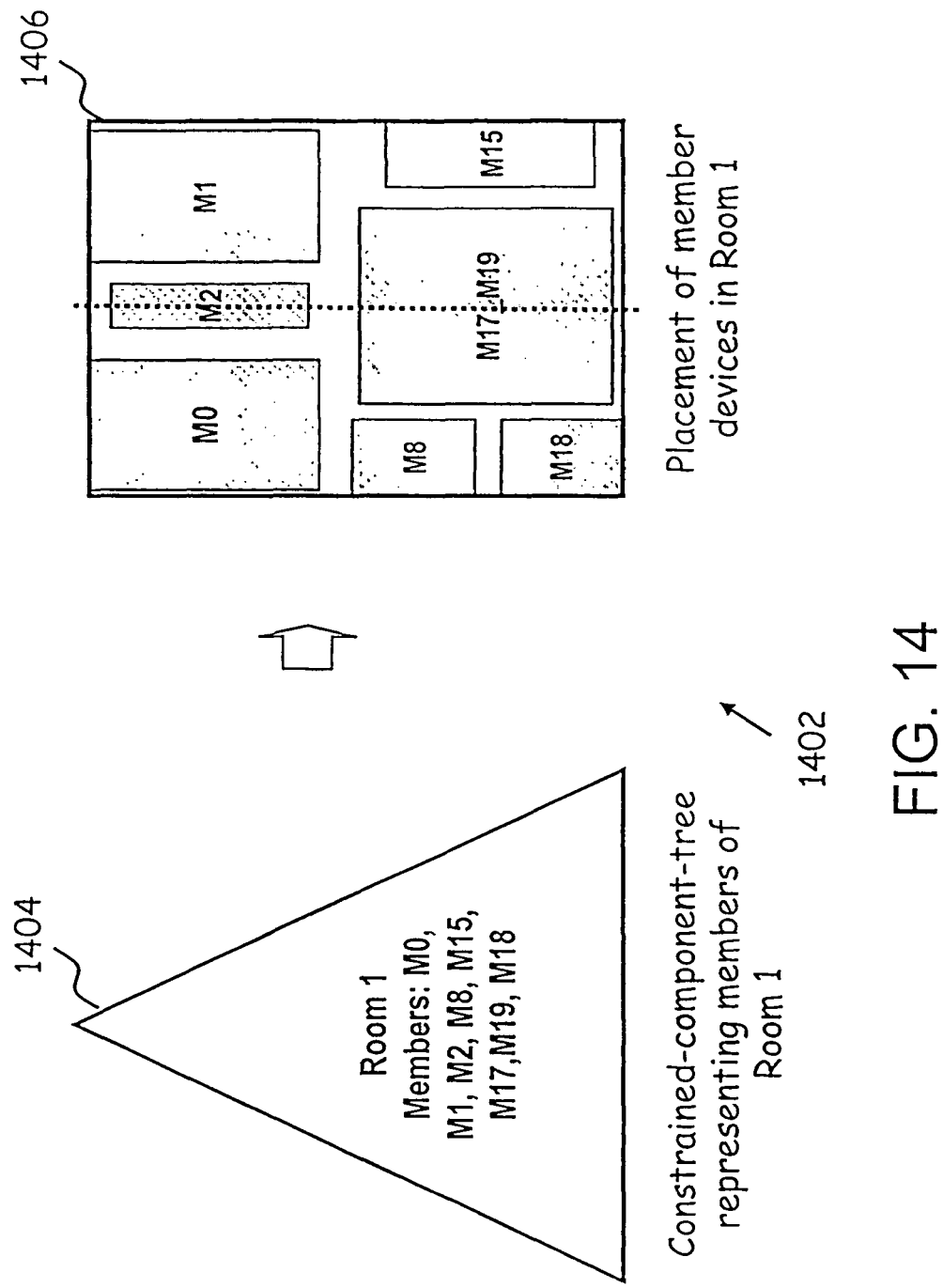
FIG. 14 shows an exemplary placement method where members of a constrained-component-tree are placed within a room.

Each of the constrained-component-trees 1308 uses a structured search to determine the spatial coordinates of individual devices in the presence of one or more device constraints like symmetry, matching and grouping. This can be used to determine device placement within each of the rooms. FIG. 14 shows an exemplary placement method 1402 where members of the constrained-component-tree 1404 corresponding to room number one (1) are placed within the room 1406 by determining the spatial coordinates for each of the individual devices M0, M1, M2, M8, M15, M17, M18 and M19.

Figure 15:
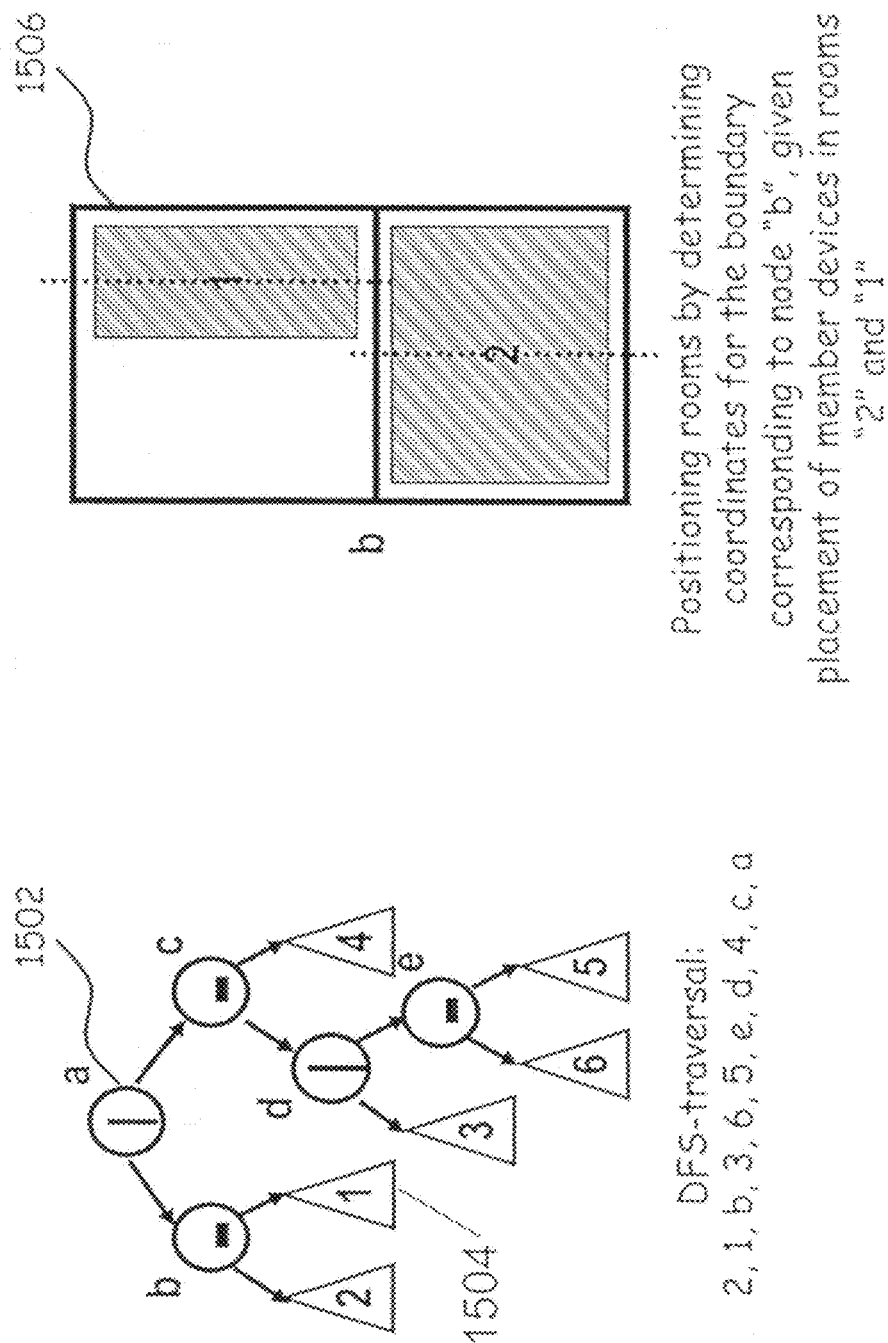
FIG. 15 shows an exemplary slicing-tree representation, including constrained-component-trees, together with a focus on the sizing of a specific node.

Once the devices within the rooms are placed, the overall cell dimensions are determined by positioning each of the rooms, which includes determining the spatial coordinates for the boundaries the rooms. This is done by using a Depth-First Search (DFS) walk of the slicing tree. For example, FIG. 15 shows a slicing-tree representation 1502, including constrained-component-trees 1504, together with a focus 1506 on the sizing of node "b" given the placement of member devices within rooms "2" and "1." In the slicing-tree representation 1502, the DFS walk of the tree would traverse the nodes in the order: "2, 1, b, 3, 6, 5, e, d, 4, c, a". While doing so, the dimensions of the components (1, 2, 3, 4, 5, 6) are determined by the placement of the devices within each of those rooms. The positions of any other node (a, b, c, d, e) are determined by stacking the node's children, in a non-overlapping fashion, horizontally in the case of a horizontal cut (or vertically in the case of a vertical cut) next to each other and computing the bounding box. When stacking the children next to each other, the order of the children is determined by the topological relationship specified by the cell-plan. For example, in FIG. 15, component "1" is specified by the slicing tree 1502 to be above component "2", as represented by the horizontal slice "b". The process is repeated until we compute the position of the node represented by "a" to give the overall positioning of all rooms in the layout. During this process, the first component ("2" in this case) can be positioned with coordinates, x=0, y=0. This can be used to locate the positions of each of the other components.

The representation discussed so far, including a slicing tree 1306 for the configuration of rooms and constrained-component-trees 1308 for the members of each of the rooms, can be further augmented to support constraints between rooms, like alignment of symmetry lines between rooms, alignment of group boundaries between rooms and designation of rooms as keep-out regions.

Figure 16:
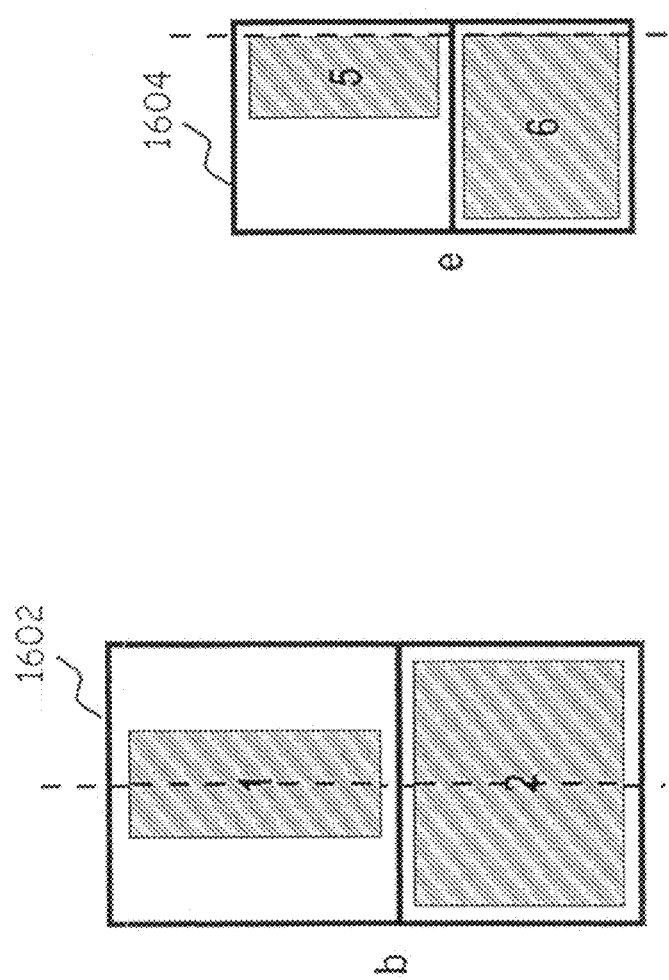
FIG. 16 shows exemplary alignments of boundary lines and symmetry lines within rooms in a cell-plan.

FIG. 16 shows an exemplary embodiment 1602 of the present invention for aligning symmetry lines at node b, during the DFS walk described above, when stacking components "1" and "2." FIG. 16 also shows an embodiment 1604 of the present invention for aligning group boundary lines at node e, during the DFS walk, when stacking components "5" and "6."

Figure 17:
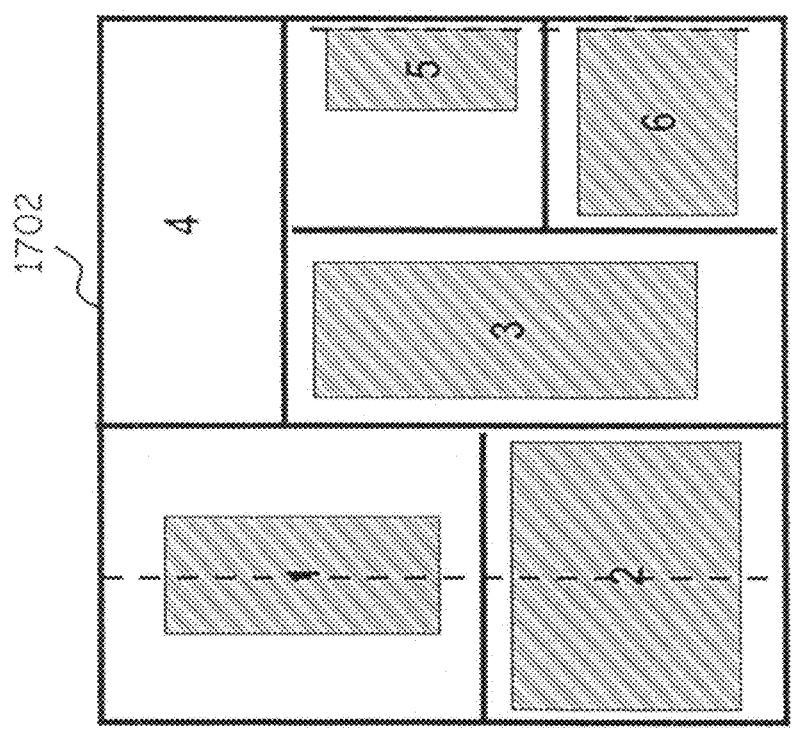
FIG. 17 shows an exemplary representation of a keep-out region in a cell-plan.

FIG. 17 shows an exemplary representation of a keep-out region according to an embodiment of the present invention. The cell-plan 1702 has a keep-out region at the fourth room so that the cell-plan has an L-shaped configuration. If certain rooms in an initial cell-plan 1702 are designated as keep-out rooms, dimensions of the component in the slicing tree representing that room can be forced to the dimensions needed by such a keep-out region. This forces the result to reserve white-space in the layout at the location of the keep-out region. By specifying such a keep-out region in a corner of a cell, one can generate a desired shape for a cell, for example, an L-shaped cell-plan 1702.

Figure 18:
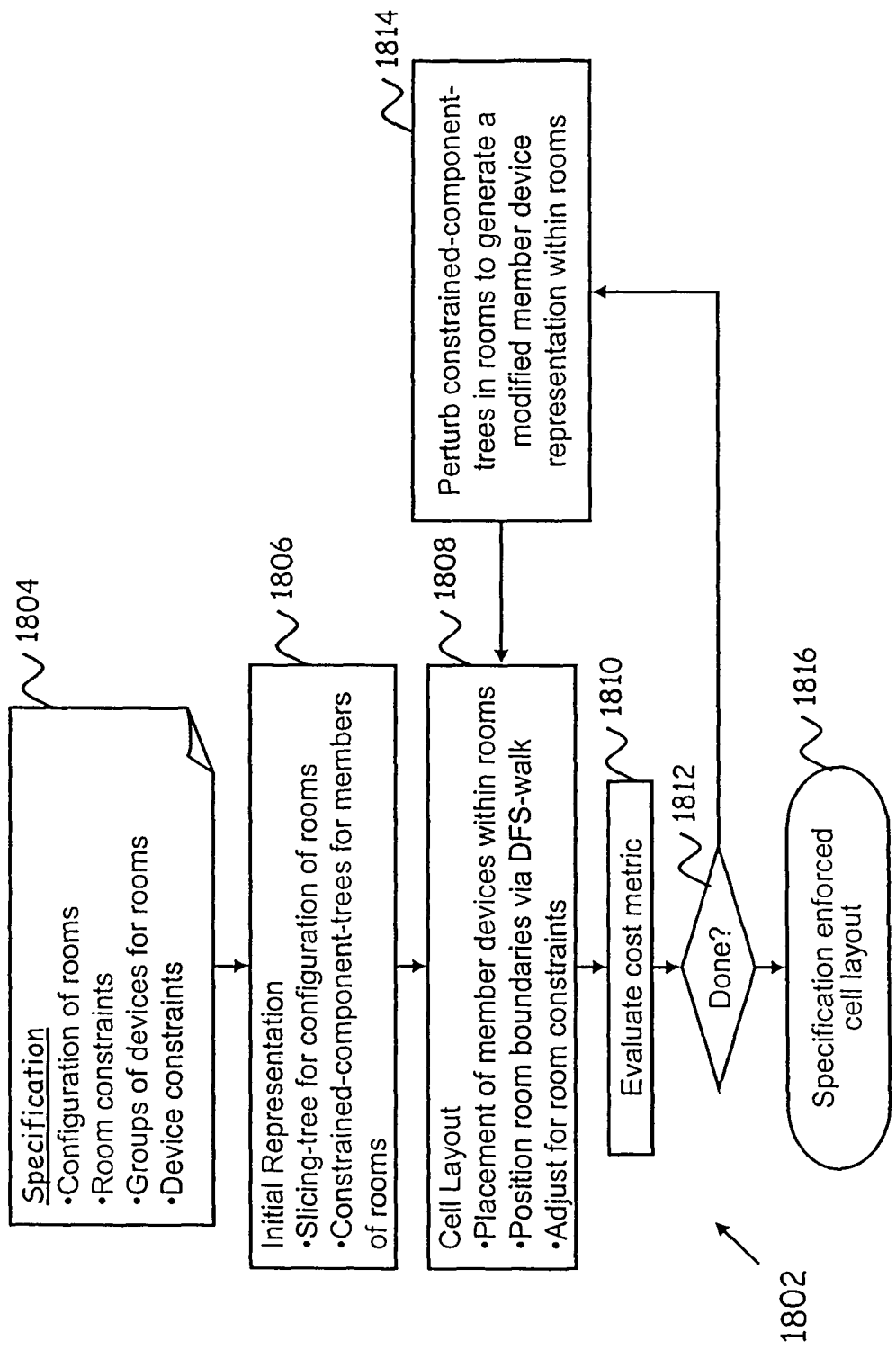
FIG. 18 shows an exemplary method for optimizing a circuit layout.

FIG. 18 shows an exemplary method 1802 for optimizing a layout design according to the present invention. The method 1802 employs a software architecture using the representation, described above, to optimize the cell layout, while enforcing the specification 1804. This specification 1804 includes the configuration of rooms, one or more room constraints for the configuration of rooms, one or more groups of devices in rooms and one or more device constraints for devices in the same room. This is used to determine an initial placement representation 1806 that includes a slicing tree for the configuration of rooms and constrained-component-trees for the members of rooms with one or more same-room constraints. The overall cell layout is determined by placing the devices within each of the rooms using a structured search of the constrained-component-tree and positioning the boundaries of the rooms through a DFS-walk of the slicing tree in 1808. This step 1808 also includes adjustment of the locations of room components (i.e., devices and/or groups of devices in rooms) to account for room constraints. A cost metric is evaluated 1810 to determine whether the overall quality of the layout is optimal, in which case the process is terminated 1812. Otherwise, the constrained-component-trees for the devices in the rooms are perturbed 1814 to generate modified constrained-component-trees for the devices in those rooms. Step 1808 is then repeated to generate a modified placement of member devices within rooms and modified positions for each of the rooms, creating a new overall cell layout. The entire process is repeated until we find an optimal cost 1810. The result is an optimal specification-enforced cell layout 1816. Note that the devices in the rooms can be perturbed 1814 by a variety of means including swapping device positions within a constrained-component-tree or changing the structure of the constrained-component-tree itself for devices within a room. Additionally, the steps of perturbing devices within rooms 1814, generating a new overall cell layout 1808, evaluating a cost metric 1810, and evaluating the termination criterion 1812 may be executed as a simulated annealing process. Note that while devices within the rooms are perturbed, the slicing tree representing the configuration of rooms remains unchanged, thereby ensuring that the cell-plan constraints are observed.

4. Alternative Embodiments of the Invention

While the above-described embodiments are directed towards software architectures using slicing trees augmented with constrained-component-trees for members within rooms and adjustments for room constraints, one can extend this approach to other representations for members within rooms that also support same-room device constraints. For example, symmetry, matching and grouping constraints may be formulated using linear equations involving the variable coordinates of devices. Then, for example, the constrained-component-trees in the representation 1806 can be augmented or replaced by linear equations (e.g. $Ax=b$, $Ax \leq b$) where the placement of devices 1808 can then be determined by solving the system of equations (e.g., solving for x). In the absence of constrained-component-trees, the placement of member devices within rooms can be perturbed 1814 by randomly relocating devices or by swapping locations of devices, and creating a new set of equations for the members within the rooms. Other steps in the above-described method 1802 may remain unchanged.

Although only certain exemplary embodiments of this invention have been described in detail above, those skilled in the art will readily appreciate that many modifications are possible in the exemplary embodiments without materially departing from the novel teachings and advantages of this invention. For example, aspects of embodiments disclosed above can be combined in other combinations to form additional embodiments. Accordingly, all such modifications are intended to be included within the scope of this invention.

What is claimed is:

1. A non-transitory computer-readable medium that stores a specification for a circuit layout, the specification comprising:
   a configuration of rooms for placing devices, wherein the rooms divide an area for the circuit layout into separated portions for placing devices, a positioning of each room being defined by spatial coordinates for its corresponding boundaries and a placement of each device being defined by spatial coordinates in a corresponding room in the configuration of rooms;
   one or more room constraints for positioning rooms in the configuration of rooms;
   one or more groups of devices for the rooms; and
   one or more device constraints relative to corresponding room boundaries for devices in a same room, wherein the specification defines a family of circuit layouts that include variations in room positionings while observing the one or more room constraints and variations in device placements within rooms while observing the one or more device constraints.

2. The non-transitory computer-readable medium of claim 1, wherein the configuration of rooms includes a tree-structure for the rooms.

3. The non-transitory computer-readable medium of claim 1, wherein the room constraints include a common symmetry line for a first room and a second room.

4. The non-transitory computer-readable medium of claim 1, wherein the device constraints include a self-symmetry constraint for a first device about a symmetry line in a first room.

5. The non-transitory computer-readable medium of claim 1, wherein the device constraints include a symmetry constraint for a first device and a second device about a symmetry line in a first room.

6. The non-transitory computer-readable medium of claim 1, wherein the devices include analog or RF (radio frequency) devices.

7. The non-transitory computer-readable medium of claim 1, wherein the boundaries of the rooms partition the area for the circuit layout, each portion of the circuit layout being identified with a corresponding room.

8. A system for determining a specification for a circuit layout, comprising:
   a user interface that receives input from a user for determining a configuration of rooms for placing devices, one or more room constraints for positioning rooms in the configuration of rooms, one or more groups of devices for the rooms, and one or more device constraints relative to corresponding room boundaries for devices in a same room, wherein the rooms divide an area for the circuit layout into separated portions for placing devices, a positioning of each room being defined by spatial coordinates for its corresponding boundaries and a placement of each device being defined by spatial coordinates in a corresponding room in the configuration of rooms;
   a computer that determines a specification for the circuit layout from the input; and
   a computer-readable medium that stores the specification for the circuit layout, the specification including the configuration of rooms, the one or more room constraints, the one or more groups of devices, and the one or more device constraints, wherein the specification defines a family of circuit layouts that include variations in room positionings while observing the one or more room constraints and variations in device placements within rooms while observing the one or more device constraints.

9. The system of claim 8, wherein the user interface includes a graphical user interface that displays a tree-structure for the configuration of rooms.

10. The system of claim 9, wherein the graphical user interface displays a reference circuit layout and the input from the user determines at least some of the tree-structure from the reference circuit layout.

11. The system of claim 9, wherein the graphical user interface displays a reference circuit schematic and the input from the user determines at least some of the tree-structure from the reference circuit schematic.

12. The system of claim 9, wherein the tree-structure includes representations for the groups of devices.

13. The system of claim 8, wherein the devices include analog or RF (radio frequency) devices.

14. The system of claim 8, wherein the boundaries of the rooms partition the area for the circuit layout, each portion of the circuit layout being identified with a corresponding room.

15. A system for storing a specification for a circuit layout, comprising:
    means for representing a configuration of rooms for placing devices, one or more room constraints for positioning rooms in the configuration of rooms, one or more groups of devices for the rooms, and one or more device constraints relative to corresponding room boundaries for devices in a same room, wherein the rooms divide an area for the circuit layout into separated portions for placing devices, a positioning of each room being defined by spatial coordinates for its corresponding boundaries and a placement of each device being defined by spatial coordinates in a corresponding room in the configuration of rooms; and
    means for storing the specification for the circuit layout, the specification including the configuration of rooms, the one or more room constraints, the one or more groups of devices, and the one or more device constraints, wherein the specification defines a family of circuit layouts that include variations in room positionings while observing the one or more room constraints and variations in device placements within rooms while observing the one or more device constraints.

16. The system of claim 15, wherein the configuration of rooms includes a tree-structure for the rooms.

17. The system of claim 15, wherein the room constraints include a common symmetry line for a first room and a second room.

18. The system of claim 15, wherein the device constraints include a symmetry constraint for a first device and a second device about a symmetry line in a first room.

19. The system of claim 15, wherein the devices include analog or RF (radio frequency) devices.

20. The system of claim 15, wherein the boundaries of the rooms partition the area for the circuit layout, each portion of the circuit layout being identified with a corresponding room.

* * * * *